United States Patent
Ko et al.

(10) Patent No.: US 7,098,835 B2
(45) Date of Patent: Aug. 29, 2006

(54) ANALOG/DIGITAL CONVERSION METHOD AND ANALOG/DIGITAL CONVERSION CIRCUIT

(75) Inventors: Shunichi Ko, Kawasaki (JP); Akihiro Fujisuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/087,713

(22) Filed: Mar. 24, 2005

(65) Prior Publication Data

US 2006/0092068 A1    May 4, 2006

(30) Foreign Application Priority Data

Nov. 2, 2004  (JP) ............... 2004-319756

(51) Int. Cl.
*H03M 1/12*   (2006.01)
*H03K 5/153*  (2006.01)

(52) U.S. Cl. .................. 341/155; 341/165; 327/60

(58) Field of Classification Search ........ 341/120–172; 327/60–90
See application file for complete search history.

(56) References Cited

U.S. PATENT DOCUMENTS 4,520,280 A * 5/1985 Yoshikawa et al. .......... 327/72
6,037,890 A * 3/2000 Glass et al. ................ 341/155

FOREIGN PATENT DOCUMENTS

JP         07-210319        8/1995

* cited by examiner

*Primary Examiner*—Lam T. Mai
(74) *Attorney, Agent, or Firm*—Arent Fox PLLC

(57) ABSTRACT

Paying attention to the difference between a subsequently inputted analog signal and a reference signal which is an analog signal converted to the digital signal immediately before for instance, changing timing dynamically for converting the analog signal to the digital signal, and converting an analog signal sampled at the timing of changing dynamically to a digital signal.

9 Claims, 7 Drawing Sheets

ANALOG/DIGITAL CONVERSION METHOD AND ANALOG/DIGITAL CONVERSION CIRCUIT

CROSS-REFERENCE TO RELATED APPLICATIONS

This application is based upon and claims the benefit of priority from the prior Japanese Patent Application No. 2004-319756, filed in Nov. 2, 2004, the entire contents of which are incorporated herein by reference.

BACKGROUND OF THE INVENTION

1. Field of the Invention

The present invention relates to a technique for sampling an analog signal and converting the sampled analog signal to a digital signal.

2. Description of the Related Art

A lot of modern electronic equipment is configured to perform a data processing through an analog to digital conversion ("AD conversion" hereinafter) of analog signal to digital signal (i.e., digital value) to control itself. The analog signal is a sensor output for instance.

The analog signal is prone to an influence of noise, wherein influence causes AD conversion of an analog signal to be overlapped with noise. This generally prompts to compute a weighted average as shown by FIG. 1 to figure out the digital signals (i.e., sampling values) within a certain time period. The example shown by FIG. 1 is a case where seven samplings are taken in a certain time period. In FIG. 1, the "converted values" show the digital signal values (i.e., sampling values) gained by converting respective analog signals. The "averages" show the averages calculated from the digital signal values gained by the respective times. In computing the weighted averages, integration by adding a predetermined number (i.e., weighting) respectively to the digital signals (i.e., sampling values) gained by AD conversion alleviates an influence of noise.

A conventional AD conversion circuit has been configured to conduct a plurality of samplings within a certain time period at a predetermined time interval which is usually very small because of being one n-th the time period for obtaining one piece of digital signal. This has caused a problem of heavy load on a data processing apparatus such as CPU for processing a digital signal obtained by such a sampling.

Presently, multiple functions and low costs are in demand for electronic products, increasing the need to make a data processing apparatus, for processing a digital signal, perform other processing in addition to the digital signal processing. Therefore, a further reduction of the load for processing a digital signal is considered very important. Also highly important is to maintain a precision of the processing.

A conventional AD conversion circuit dealing with an analog signal overlapped with noise is the one noted in a Japanese patent laid-open application publication No. 7-210319. The conventional AD conversion circuit noted in the aforementioned publication is equipped with a switch having a terminal for receiving an analog signal and another terminal being connected with the ground on the front end of the AD converter so as to switch the switch in response to the result of detecting noise, thereby preventing an analog signal overlapped with noise from being sampled by connecting the AD converter with ground when a noise is detected.

In the conventional AD conversion circuit noted in the Japanese patent laid-open application publication No. 7-210319, however, a data processing apparatus must be disposed for the processing in dealing with a change of sampling object, because switching the switch changes the sampling object, hence further increasing the load for processing the digital signal.

SUMMARY OF THE INVENTION

The purpose of the present invention is to provide a technique for alleviating a load for processing a digital signal obtained by converting an analog signal, while maintaining the accuracy of processing the digital signal.

An AD conversion method of the first aspect of the present invention, assuming to be applied for converting a sampled analog signal to a digital signal, comprises: monitoring a difference between a subsequently inputted analog signal and a reference signal which is an analog signal converted to the digital signal immediately before; and sampling an analog signal inputted at the time when the difference becomes outside a predetermined range and converting the sampled analog signal to a digital signal.

An AD conversion method of the second aspect of the present invention, assuming to be applied for obtaining a digital signal gained by converting a sampled analog signal, comprises: monitoring a difference between either one of subsequently obtained digital signal and analog signal to be converted to the digital signal and a reference signal which is either one of the digital signal obtained immediately before and analog signal converted to the digital signal; and obtaining a digital signal gained by converting an analog signal inputted at the time when the difference becomes outside a predetermined range.

An AD conversion method of the third aspect of the present invention, assuming to be applied for converting a sampled analog signal to a digital signal, comprises: changing timing dynamically for converting the analog signal to the digital signal by paying attention to a momentary change of the analog signal, and sampling the analog signal at the timing of changing dynamically and converting the sampled analog signal to the digital signal.

An AD conversion circuit of the first aspect of the present invention, assuming to be applied for converting a sampled analog signal to a digital signal, comprises an AD conversion unit for converting the sampled analog signal to a digital value, a signal retention unit for retaining an analog signal converted by the AD conversion unit immediately before, a comparator unit for comparing the analog signal retained by the signal retention unit with a subsequently inputted analog signal, and a management unit for making the AD conversion unit convert an analog signal inputted at the time when a difference between analog signals compared by the comparator unit becomes outside a predetermined range to a digital signal and making the signal retention unit retain the analog signal.

An AD conversion circuit of the second aspect of the present invention, assuming to be applied for converting a sampled analog signal to a digital signal, comprises a timing determination unit for determining timing dynamically for converting the analog signal to the digital signal by paying attention to a momentary change of the analog signal, and an AD conversion unit for sampling the analog signal according to the timing determined dynamically by the timing determination unit and converting the sampled analog signal to a digital value.

An AD conversion circuit of the third aspect of the present invention, in addition to the comprisal of the above described first or second aspects thereof, further comprises a time measurement unit for measuring a time interval between the time when said AD conversion unit converts to said digital signal and the next time when the AD conversion unit does the same.

An AD conversion circuit of the fourth aspect of the present invention, in addition to the comprisal of the above described first or second aspects thereof, further comprises a signal obtainment unit for obtaining the digital signal, an information obtainment unit for obtaining time information indicating a time interval between the time when the signal obtainment unit obtains the digital signal and the next time when the signal obtainment unit obtains a digital signal, and a value calculation unit for calculating a digital signal value in a predetermined time period by using the digital signal obtained by the signal obtainment unit and the time information obtained by the information obtainment unit.

The present invention, by paying attention to a momentary change of analog signal, pays attention to the difference between a subsequently inputted analog signal and a reference signal which is an analog signal converted to a digital signal immediately before for instance, changes timing dynamically for converting an analog signal to a digital signal, and converts the analog signal sampled at the time of changing timing dynamically to the digital signal.

Changing the timing dynamically makes it possible to obtain a required digital signal at a required time. It is possible to avoid an obtainment when there is no, or low, need to obtain a digital signal. This enables a load for digital signal processing to be alleviated while maintaining an accuracy thereof gained by converting an analog signal.

DESCRIPTION OF THE PREFERRED EMBODIMENTS

A preferred embodiment according to the present invention is described in the following while referring to the accompanying drawings.

Figure 1:
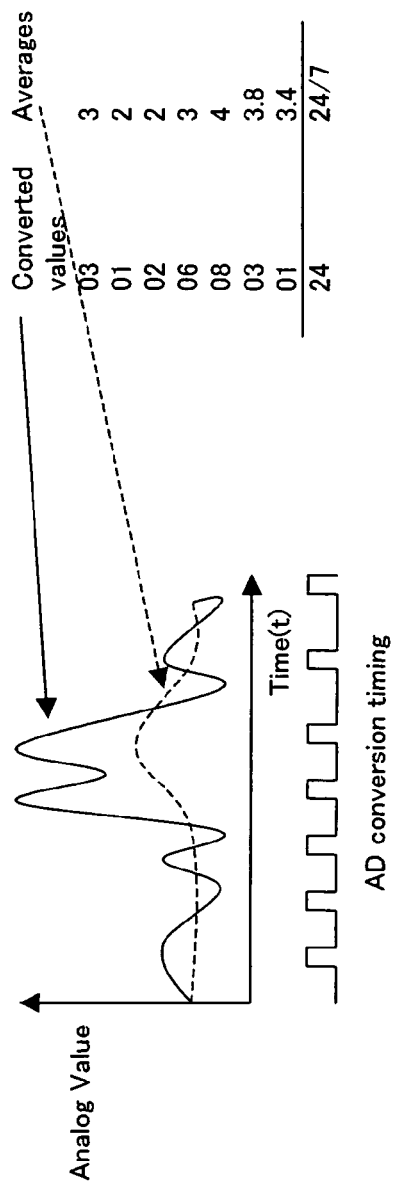
FIG. 1 describes a conventional method for calculating the average of digital signals obtained in a certain time.
Figure 2:
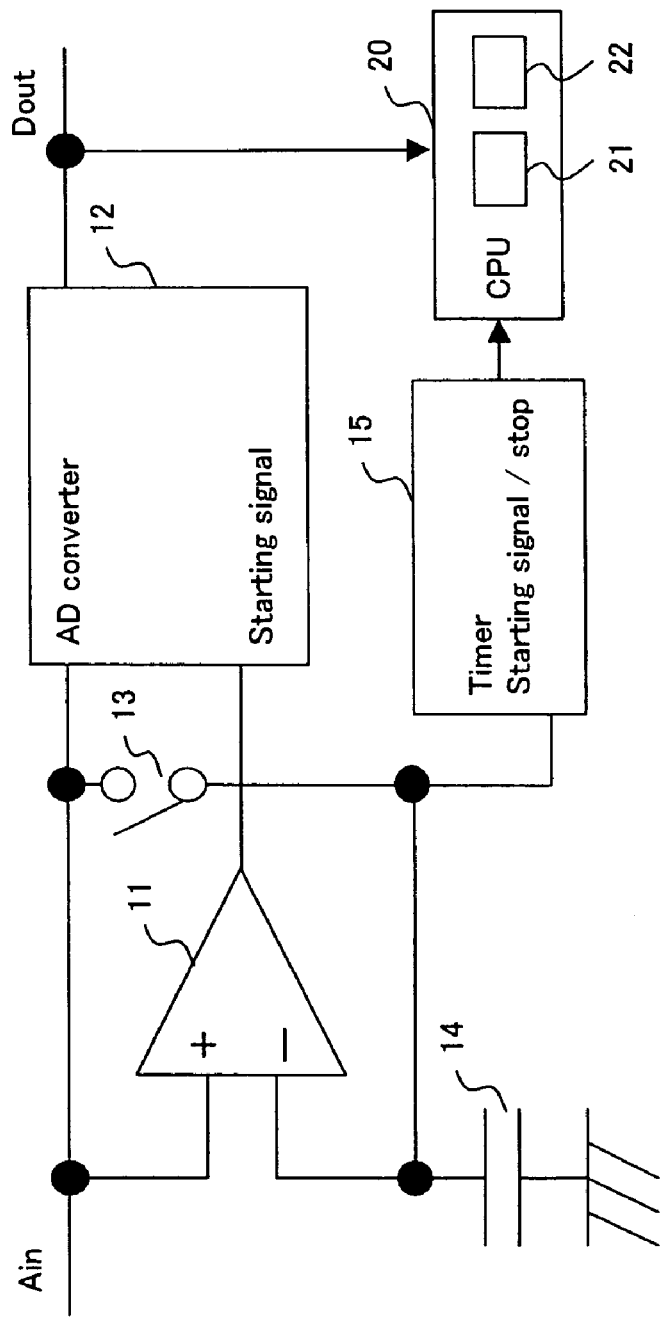
FIG. 2 describes a configuration of sampling system applied by an AD conversion circuit according to the present embodiment.

FIG. 2 describes a configuration of a sampling system applied by an AD conversion circuit according to the present embodiment. In FIG. 2, the AD conversion circuit according to the present embodiment comprises a comparator 11, an AD converter 12, a switch 13, a capacitor 14 and a timer 15.

An analog signal Ain is outputted from a not shown sensor for instance, and inputted to the AD converter 12 and the non-inversion input terminal (the plus pole) of the comparator 11. The converter 12 performs a sampling operation prompted by an output of the comparator 11 as the starting signal so as to convert the analog signal Ain to a digital signal (i.e., sampling value) Dout to output.

The switch 13 is located between the AD converter 12 and the timer 15. One of the two terminals of the capacitor 14 is connected with the ground, while the other is connected with the switch 13 and the inversion input terminal (the minus pole) of the comparator 11, respectively.

When the switch 13 is closed, the capacitor 14 is charged with the analog signal Ain. The comparator 11 is disposed for comparing an analog signal Ain subsequently inputted to the non-inversion terminal with a reference signal (e.g., comparison in the voltage values) which is an analog signal Ain charged in the capacitor 14 and reflect the comparison result in the output signal.

The present embodiment is configured to vary the output signal (i.e., comparison result) depending on whether or not the difference between an analog signal Ain inputted to the non-inversion input terminal and the reference signal is within a predetermined range. By the practice, the output signal is made active only when the voltage value of the analog signal Ain is equal to or larger beyond a certain value than the voltage value of the reference signal, or is equal to or less beyond the certain value than the voltage value of the reference signal, so as to make the AD converter convert the analog signal Ain to the digital signal Dout.

The CPU 20 as data processing apparatus comprises a ROM 21 for storing the program to be executed and the data used for various controls, and a RAM 22 used as the work area. The CPU 20 performs the processing of the digital signal Dout and controlling the not shown equipment or devices by executing the program stored in the ROM21.

Figure 3:
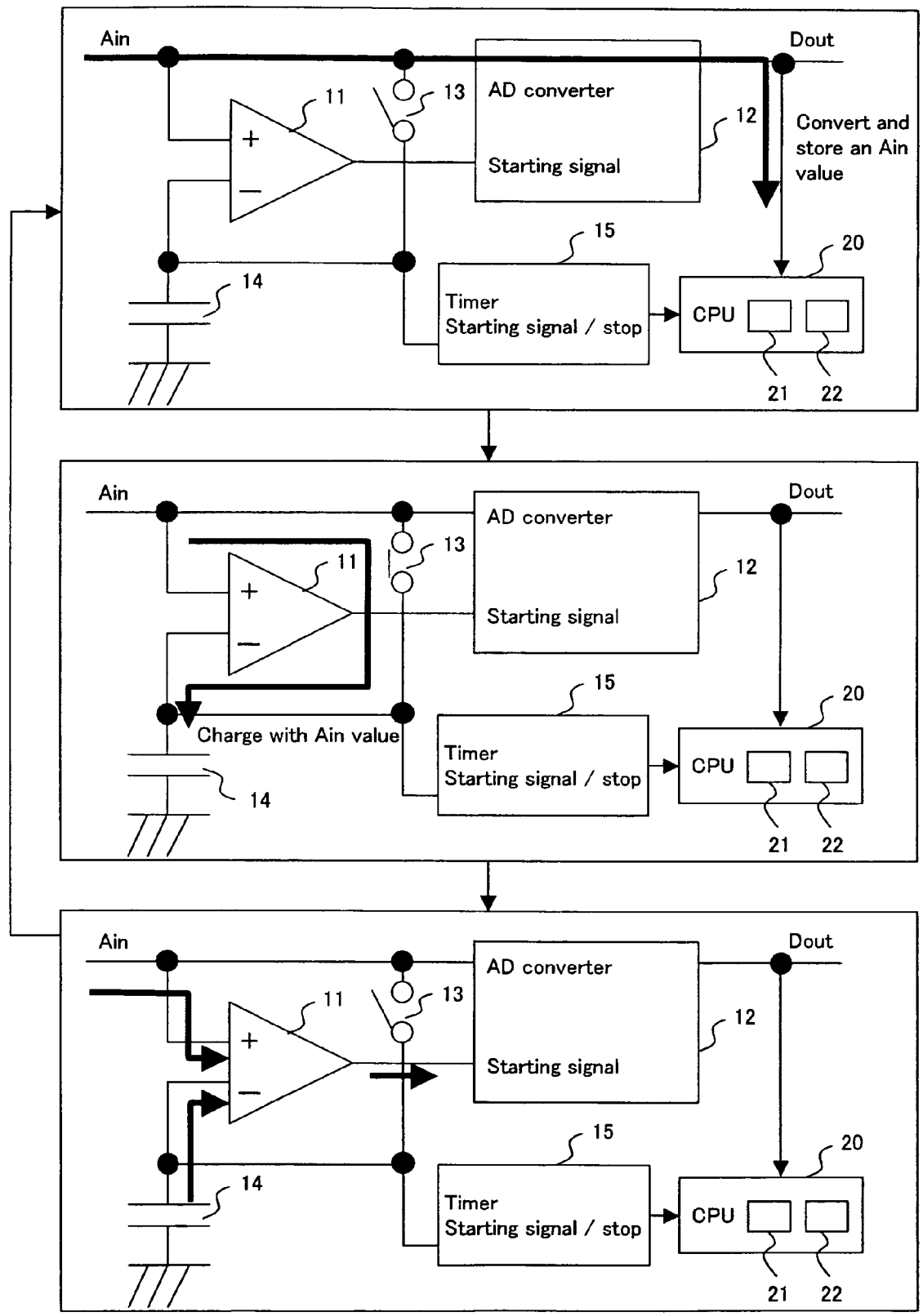
FIG. 3 describes an operation of sampling system applied by an AD conversion circuit according to the present embodiment.

FIG. 3 describes an operation of a sampling system applied by an AD conversion circuit according to the present embodiment, which will be used for describing the operation thereof specifically as follows.

The operation of the sampling system can be categorized as three states, i.e., a sampling state for sampling, a charging state for charging the capacitor 14 with an analog signal Ain and a comparing state for comparing an analog signal Ain with a reference signal. The way FIG. 3 shows the sampling system is in: a sampling state in the upper; a charging state in the middle and a comparing state in the bottom drawings, respectively.

When an output signal of the comparator 11 becomes active, the AD converter 12 samples an analog signal Ain and outputs the digital signal Dout, prompting the CPU 20 for inputting the digital signal Dout to store in the RAM 22, obtaining a timer value from the timer 15, on the other hand, to store in the RAM 22 together with the digital signal, making the timer 15 stop measuring time and outputting a stop signal for the timer 15 to clear the timer value.

The AD converter, upon finishing the sampling, outputs an interrupt signal for indicating the sampling finish. The interrupt signal is outputted to the switch 13 in addition to the CPU 20. The switch 13 becomes closed from open by the interrupt signal, making the sampling system transition to a charging state and the analog signal Ain be outputted to the capacitor 14 and the timer 15 by way of the switch 13. As a result, the capacitor is charged with an analog signal Ain and the timer starts to measure time a new.

Upon ending to output the interrupt signal, transitions from the charging state to the comparing state in which the comparator 11 compares the analog signal Ain with a reference signal to output the comparison result as the output signal. By this, a change in the analog signal Ain is monitored in the way of being compared with the reference signal. As a result of this, when the difference between the analog signal Ain and the reference signal becomes outside the predetermined range, the comparator outputs the active output signal to the AD converter 12, making the sampling system transition to the sampling state.

Figure 4:
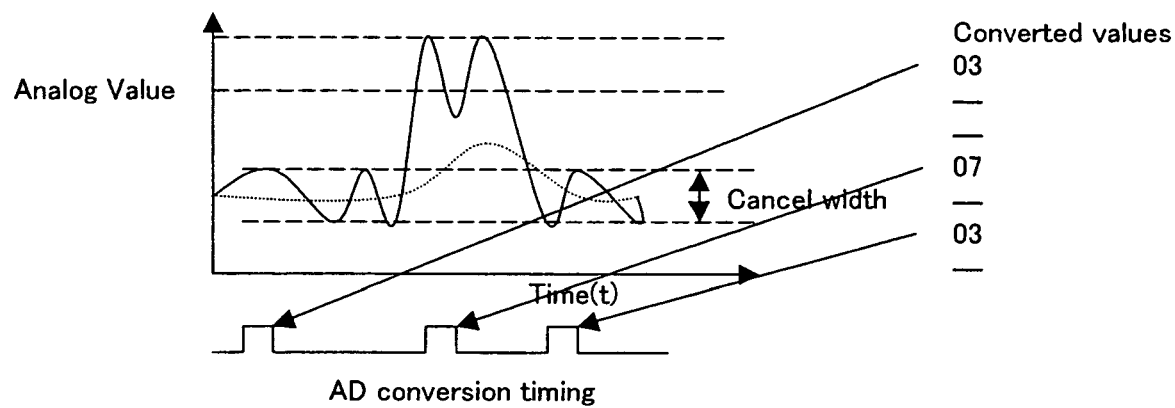
FIG. 4 describes sampling timing by an analog signal.

FIG. 4 describes sampling timing by an analog signal Ain, in which the sampling timing is noted as "AD conversion timing." FIG. 4 hence indicates three times where sampling occurs while inputting an analog signal Ain which is indicating the momentary change as shown by the wave.

A plurality of dotted lines in parallel with the time axis is delineated in the area indicated by the wave of the analog signal Ain. These dotted lines show the levels of analog signal Ain (i.e., analog values (in terms of volts)) as the next sampling object with the sampled analog signal Ain at the immediate past sampling timing being defined as the reference signal. Based on this, a sampling is done at the timing shown by FIG. 4.

The distance between the adjacent dotted lines functions as canceling width for ignoring the change in the analog signal Ain. Because of this, a sampling will not be done unless the analog signal Ain changes at least a certain degree. This certainly avoids a case where the frequency of samplings becomes unnecessarily high due to an instantaneous small fluctuation of analog signal Ain caused by some generic noises or a noise other than that overlapped with the analog signal Ain itself.

For instance, an airbag on board an automobile operates only as required. There are diverse kinds of equipment required to do so. For operation controls of such equipment, a digital signal converted from an analog signal outputted by a sensor has continuously been monitored.

Whereas the present embodiment enables an AD conversion circuit to perform the monitoring instead of a data processing apparatus doing it. This in turn enables the data processing apparatus to perform a processing only corresponding to a digital signal outputted from the AD conversion circuit. The processing can easily be used for an interrupt processing. As such, it is possible to alleviate a load on the data processing apparatus performing processing while maintaining the processing accuracy by applying the above described technique to a usage where a required operation is only performed as required. As a result, it is possible to use the data processing apparatus easily for another purpose as well.

It is also possible to at least maintain a processing accuracy even in the case where a continuous monitoring of digital signals such as a calculation of digital signal value within a certain time period (e.g., the average is conveniently assumed herein). If the momentary change of analog signal is relatively gradual, causing the sampling interval to become larger, the average can be calculated in a high accuracy because the momentary change is small. The load for processing is reduced a great deal. If the momentary change is relatively large, causing the sampling interval to become smaller, therefore the average can also be calculated in a high accuracy.

Figure 5:
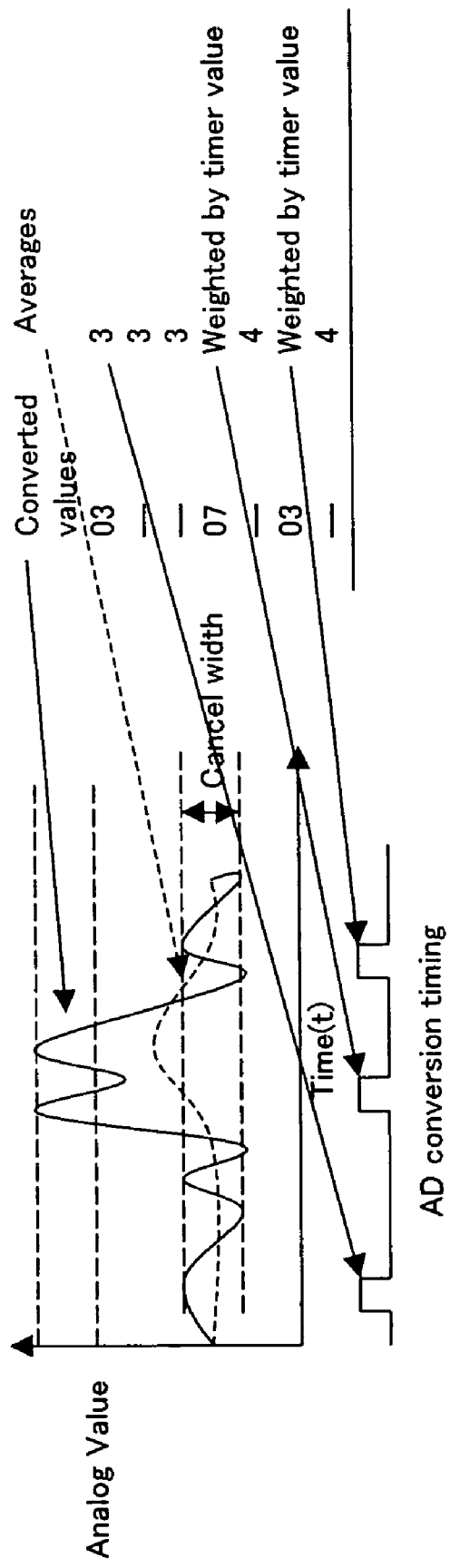
FIG. 5 describes a method for calculating the average of digital signals obtained in a certain time period.

FIG. 5 describes a method for calculating the average of digital signals Dout obtained in a certain time period. The AD conversion timing and the dotted lines shown in FIG. 5 mean the same thing as in FIG.

It is not possible to know the sampling interval beforehand. That is why the contrivance is to calculate the average by weighting for the digital signal value Dout (i.e., converted value) by using the timer value indicating the sampling interval. FIG. 5 shows the final calculated average of four (4).

Figure 6:
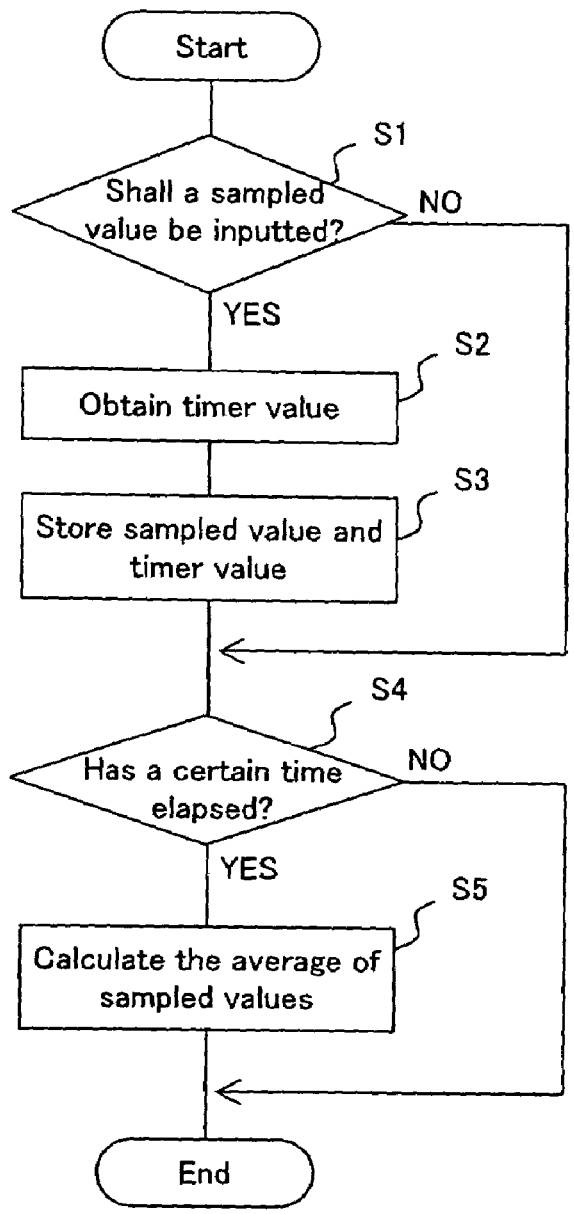
FIG. 6 is a flow chart of digital signal input processing.

FIG. 6 is a flow chart of digital signal input processing which is a processing executed for inputting a digital signal Dout from the AD converter 12 and calculating the average of the digital signals Dout in a certain time period. The input processing will now be described in detailed by referring to FIG. 6. The input processing is for instance initiated by the AD converter 12 outputting an interrupt signal at a sampling start or a timer interrupt signal at the passing of a certain time. The input processing itself is accomplished by the CPU 20 executing the program stored in the ROM 21.

First, in the step S1, whether or not the state is suitable to input a digital signal (i.e., "sampled value" shown by FIG. 6) Dout is judged. If the input processing has been initiated by an interrupt signal from the AD converter 12, the judgment is "yes", and the processing proceeds to the step S2. If not, the judgment is "no", and the processing proceeds to the step S4.

In the step S2, a digital signal Dout is inputted from the AD converter 12, and a timer value is obtained from the timer 15. In the subsequent step S3, the inputted digital signal Dout and the timer value are stored in the RAM 22. Then, proceeding to the step S4, whether or not a certain time has elapsed is judged. If the current input processing has been initiated by an interrupt signal from the AD converter 12, the judgment is "yes", then, proceeding to the step S5, the average is calculated by using the digital signals Dout and the timer value stored in the RAM 22, followed by finishing a series of processing. If not, the judgment is "no", and a series of processing is ended.

By paying attention to a momentary change of analog signal Ain, the time interval of the AD converter 12 outputting the digital signals changes dynamically in proportion to the degree of the aforementioned momentary change. The time interval is nominally larger than the conventional method. This enables the above described digital signal input processing to be executed less frequently, resulting in reducing the processing load in great deal as compared with the conventional method.

Figure 7:
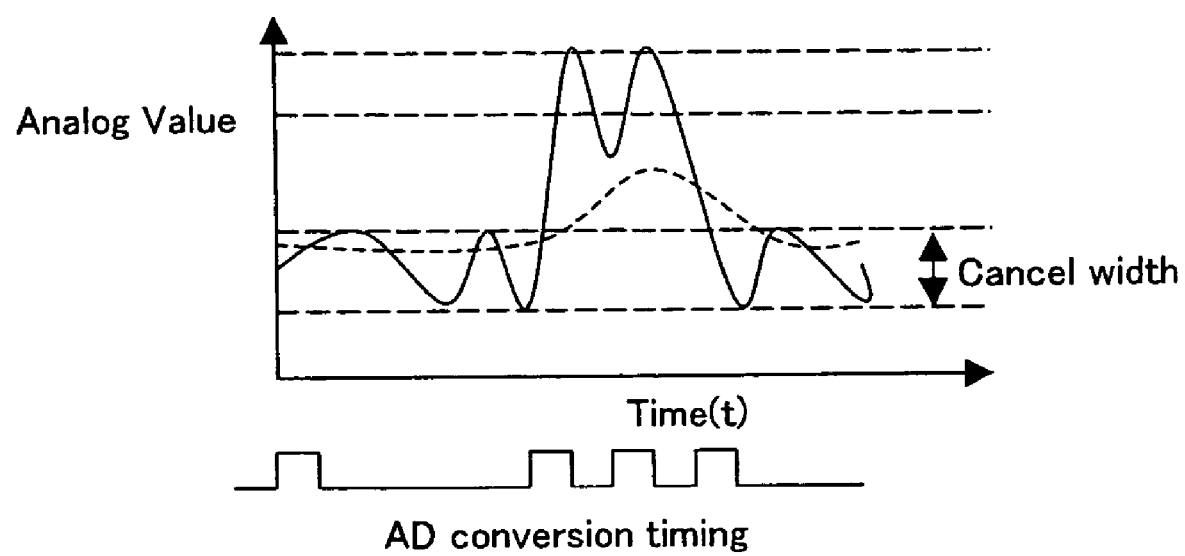
FIG. 7 describes sampling timing by an analog signal (according to another embodiment).

Note that while an output signal from the comparator 11 makes the AD converter 12 operate in the present embodiment, an output signal from other units may make the AD converter 12 operate. With that, once a sampling is initiated by an output signal of the comparator 11 becoming active, the subsequent samplings may be made to perform at least once in a short time interval regardless of the level of the aforementioned signal as exemplified by FIG. 7.

Meanwhile, while the timing for sampling is dynamically determined by comparing an analog signal Ain with a reference signal which is an analog signal Ain charged in the capacitor 14 in the present embodiment, the reference signal may be made available by a different method. A sampling may thus be done when an analog signal Ain exceeds or comes under any of the fixed reference signals, respectively.

While the calculated average is obtained for the value of digital signal Dout in a certain time period, the accumulated value may be calculated instead. Furthermore, an output signal of the comparator 11 may be used as a digital signal Dout for an input to CPU 20, in addition to initiating the AD converter 12.

What is claimed is:

1. An AD conversion method for sampling an analog signal and converting the sampled analog signal to a digital signal, the method comprising:

monitoring a difference between a subsequently inputted analog signal and a reference signal which is an analog signal converted to the digital signal immediately before; and sampling an analog signal inputted at the time when the difference becomes outside a predetermined range and converting the sampled analog signal to the digital signal.

2. An AD conversion method for obtaining a digital signal by converting a sampled analog signal, the method comprising:

monitoring a difference between either one of subsequently obtained digital signal and analog signal to be converted to the digital signal and a reference signal which is either one of the digital signal obtained immediately before and analog signal converted to the digital signal; and obtaining a digital signal by converting an analog signal inputted at the time when the difference becomes outside a predetermined range.

3. An AD conversion method for sampling an analog signal and converting the sampled analog signal to a digital signal, the method comprising:

changing dynamically timing for converting the analog signal to the digital signal in accordance with a momentary change of the analog signal, and sampling the analog signal at the dynamically changed timing and converting the sampled analog signal to the digital signal.

4. An AD conversion circuit for sampling an analog signal and converting the sampled analog signal to a digital signal, comprising:

an AD conversion unit for converting the sampled analog signal to a digital value;

a signal retention unit for retaining an analog signal converted by the AD conversion unit immediately before;

a comparator unit for comparing the analog signal retained by the signal retention unit with a subsequently inputted analog signal; and a control unit for making the AD conversion unit convert an analog signal inputted at the time when a difference between analog signals compared by the comparator unit becomes outside a predetermined range to a digital signal and making the signal retention unit retain the analog signal inputted at the time.

5. The AD conversion circuit according to claim 4, further comprising a time measurement unit for measuring a time interval between the time when said AD conversion unit converts to said digital signal and the next time when the AD conversion unit does the same.

6. An AD conversion circuit for sampling an analog signal and converting the sampled analog signal to a digital signal, comprising:

a timing determination unit for determining dynamically timing for converting the analog signal to the digital signal in accordance with a momentary change of the analog signal; and an AD conversion unit for sampling the analog signal according to the timing determined dynamically by the timing determination unit and converting the sampled analog signal to a digital value.

7. The AD conversion circuit according to claim 6, further comprising a time measurement unit for measuring a time interval between the time when said AD conversion unit converts to said digital signal and the next time when the AD conversion unit does the same.

8. The AD conversion circuit according to claim 4, further comprising:

a signal obtainment unit for obtaining said digital signal;

an information obtainment unit for obtaining time information indicating a time interval between the time when the signal obtainment unit obtains the digital signal and the next time when the signal obtainment unit obtains a digital signal; and a value calculation unit for calculating a digital signal value in a predetermined time period by using the digital signal obtained by the signal obtainment unit and the time information obtained by the information obtainment unit.

9. The AD conversion circuit according to claim 8, wherein said value calculation unit applies weighting to the digital signal value obtained by said signal obtainment unit according to the time information obtained by said information obtainment unit and calculates at least either one of an averaged value or an accumulated value as the digital signal value for said predetermined time period.

* * * * *

UNITED STATES PATENT AND TRADEMARK OFFICE
CERTIFICATE OF CORRECTION

| | | |
|---|---|---|
| PATENT NO. | : 7,098,835 B2 | Page 1 of 1 |
| APPLICATION NO. | : 11/087713 | |
| DATED | : August 29, 2006 | |
| INVENTOR(S) | : Shunichi Ko et al. | |

It is certified that error appears in the above-identified patent and that said Letters Patent is hereby corrected as shown below:

Title page
In (75) Inventors Information, please correct the second Inventors name as follows:

"Akihiro FUJISUKA"

To

--Akihiro FUJITSUKA--

Signed and Sealed this

Nineteenth Day of December, 2006

JON W. DUDAS
*Director of the United States Patent and Trademark Office*